(12) United States Patent
Du et al.

(10) Patent No.: US 9,543,383 B2
(45) Date of Patent: Jan. 10, 2017

(54) HIGH-SPEED HIGH-POWER SEMICONDUCTOR DEVICES

(75) Inventors: Yang Du, Carlsbad, CA (US); Vladimir Aparin, San Diego, CA (US); Robert P. Gilmore, Poway, CA (US)

(73) Assignee: QUALCOMM Incorporated, San Diego, CA (US)

( * ) Notice: Subject to any disclaimer, the term of this patent is extended or adjusted under 35 U.S.C. 154(b) by 165 days.

(21) Appl. No.: 13/103,918

(22) Filed: May 9, 2011

(65) Prior Publication Data

US 2012/0211812 A1 Aug. 23, 2012

Related U.S. Application Data

(60) Provisional application No. 61/444,072, filed on Feb. 17, 2011.

(51) Int. Cl.
| | | |
|---|---|---|
| *H01L 29/40* | (2006.01) | |
| *H01L 29/06* | (2006.01) | |
| *H01L 29/66* | (2006.01) | |
| *H01L 29/78* | (2006.01) | |
| *H01L 29/423* | (2006.01) | |

(Continued)

(52) U.S. Cl.
CPC ....... *H01L 29/0653* (2013.01); *H01L 29/0692* (2013.01); *H01L 29/402* (2013.01); *H01L 29/42384* (2013.01); *H01L 29/66659* (2013.01); *H01L 29/66689* (2013.01); *H01L 29/7824* (2013.01); *H01L 29/7835* (2013.01);
(Continued)

(58) Field of Classification Search
CPC ......... H01L 27/06; H01L 27/10; H01L 29/402
See application file for complete search history.

(56) References Cited

U.S. PATENT DOCUMENTS 7,936,553 B2* 5/2011 Oakes et al. .................. 361/277
2008/0093667 A1 4/2008 Shibib et al.
(Continued)

FOREIGN PATENT DOCUMENTS

| CN | 101203960 A | 6/2008 |
|---|---|---|
| JP | 2010157582 A | 7/2010 |

(Continued)

OTHER PUBLICATIONS

International Search Report and Written Opinion—PCT/US2012/025733—ISA/EPO—Jul. 6, 2012.
(Continued)

*Primary Examiner* — Jae Lee
(74) *Attorney, Agent, or Firm* — Xiaotun Qiu

(57) ABSTRACT

High-speed high-power semiconductor devices are disclosed. In an exemplary design, a high-speed high-power semiconductor device includes a source, a drain to provide an output signal, and an active gate to receive an input signal. The semiconductor device further includes at least one field gate located between the active gate and the drain, at least one shallow trench isolation (STI) strip formed transverse to the at least one field gate, and at least one drain active strip formed parallel to, and alternating with, the at least one STI strip. The semiconductor device may be modeled by a combination of an active FET and a MOS varactor. The active gate controls the active FET, and the at least one field gate controls the MOS varactor. The semiconductor device has a low on resistance and can handle a high voltage.

25 Claims, 12 Drawing Sheets

(51) Int. Cl.
*H01L 29/786* (2006.01)
*H01L 29/10* (2006.01)

(52) U.S. Cl.
CPC .. *H01L 29/78624* (2013.01); *H01L 29/78645* (2013.01); *H01L 29/1045* (2013.01)

(56) References Cited

U.S. PATENT DOCUMENTS

| | | | |
|---|---|---|---|
| 2008/0224233 A1 | 9/2008 | Masliah | |
| 2009/0256199 A1* | 10/2009 | Denison | H01L 29/0653 257/343 |
| 2010/0140715 A1* | 6/2010 | Nakamura | H01L 29/0653 257/368 |
| 2010/0163987 A1 | 7/2010 | Nakagawa | |
| 2011/0193167 A1* | 8/2011 | Fung | H01L 21/26506 257/350 |
| 2012/0043608 A1* | 2/2012 | Yang et al. | 257/336 |

FOREIGN PATENT DOCUMENTS

| | | |
|---|---|---|
| JP | 2010157688 A | 7/2010 |
| WO | 2010046794 A1 | 4/2010 |

OTHER PUBLICATIONS

Sonsky J., et al., "Innovative High Voltage transistors for complex HV/RF SoCs in baseline CMOS", VLSI Technology, Systems and Applications, 2008. VLSI-TSA 2008. International Symposium on, IEEE, Piscataway, NJ, USA, Apr. 21, 2008, pp. 115-116, XP031258840, ISBN: 978-1-4244-1614-1 the whole document.

Udrea F, "SOI-based Devices and Technologies for High Voltage ICs", Bipolar/BiCMOS Circuits and Technology Meeting, 2007. BCTM '07. IEEE, Sep. 30, 2007, pp. 74-81.

Perez-Gonzalez J., et al., "HCI Reliability Control in HV-PMOS Transistors: Conventional EDMOS vs Dielectric Resurf and Lateral Field Plates", 21st International Symposium on Power Semiconductor Devices & IC's, IEEE, IEDM, Jun. 2009, pp. 61-64.

* cited by examiner

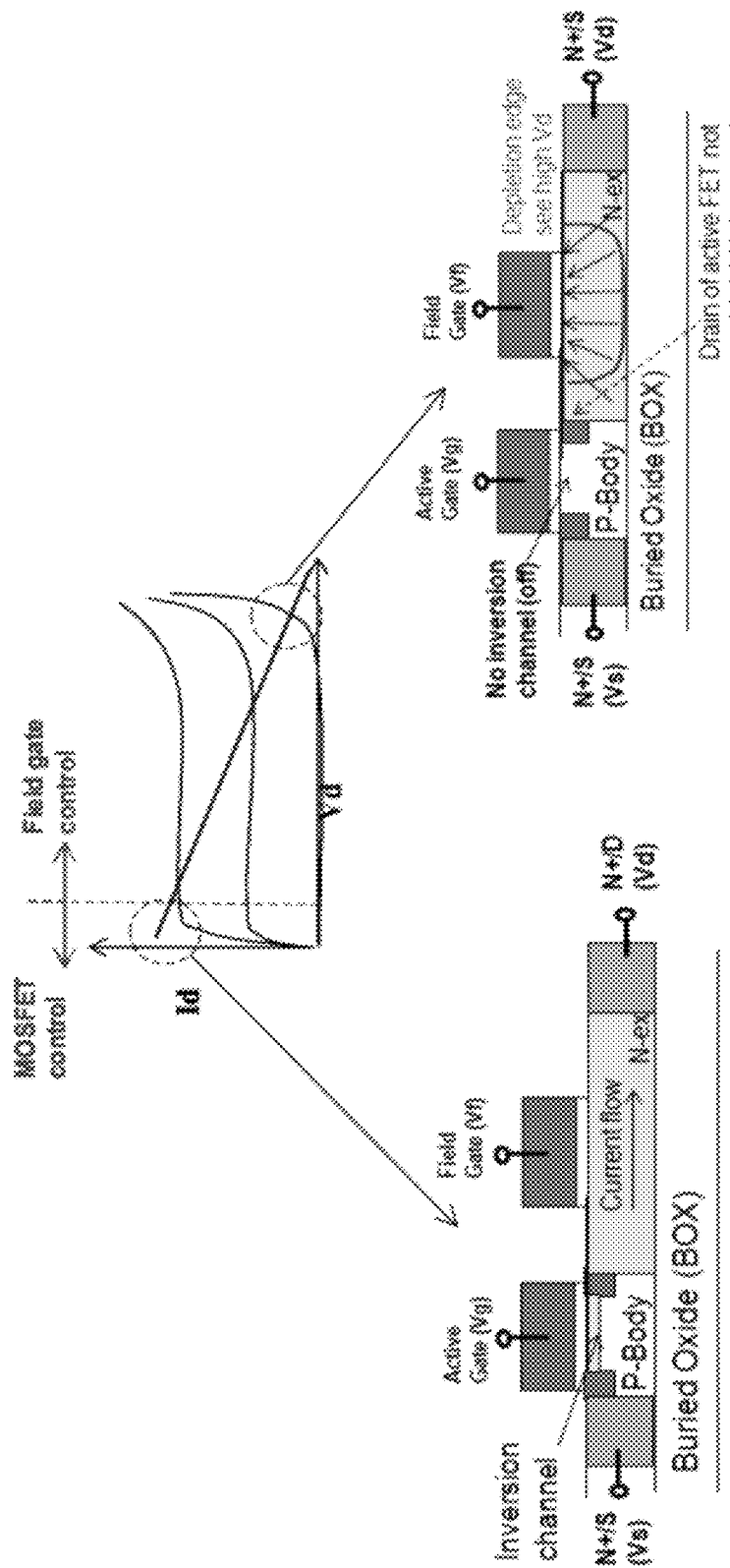

US 9,543,383 B2

HIGH-SPEED HIGH-POWER SEMICONDUCTOR DEVICES

CLAIM OF PRIORITY UNDER 35 U.S.C. §119

The present Application for Patent claims priority to Provisional U.S. Application Ser. No. 61/444,072, entitled "HIGH-SPEED HIGH-POWER SEMICONDUCTOR DEVICES," filed Feb. 17, 2011, assigned to the assignee hereof, and expressly incorporated herein by reference.

BACKGROUND

I. Field

The present disclosure relates generally to electronics, and more specifically to semiconductor devices.

II. Background

Semiconductor devices such as transistors are commonly used in various active circuits such as power amplifiers. A power amplifier can provide amplification and high output power for a signal prior to transmission over the air. Hence, power amplifiers are used in virtually all wireless communication systems and in wireless devices as well as base stations.

A radio frequency (RF) power amplifier may impose conflicting requirements on transistors used to implement the power amplifier. For example, the high-speed RF power amplifier may require (i) a high breakdown voltage for the transistors in order to handle a large voltage swing and (ii) a high frequency of operation in order to handle an RF signal. For a transistor fabricated with a complementary metal oxide semiconductor (CMOS) integrated circuit (IC) process, the speed of the transistor may be increased by reducing the length of the gate. However, a shorter gate length also reduces the breakdown voltage of the transistor, which then limits the transistor's ability to handle a large voltage swing required for a power amplifier. Hence, it is difficult to obtain a high breakdown voltage and a high frequency of operation for CMOS transistors.

One conventional technique for achieving high speed and high output power for a power amplifier is to stack a number of transistors in a cascode configuration. Each transistor in the stack may then observe only a fraction of the output voltage swing. However, stacking transistors may result in degraded efficiency and a challenging circuit design in order to properly bias the transistors, avoid instability and oscillation, and simultaneously achieve high output power and efficiency. Another conventional technique for achieving high speed and high output power for a power amplifier is to construct transistors using a complicated device architecture. However, such a device architecture is often incompatible with standard CMOS process flow, which may require more mask and process steps to fabricate the transistors, may be difficult to integrate with conventional CMOS integrated circuits, and may result in higher cost. An RF power amplifier that is not difficult to fabricate and has low cost is thus highly desirable.

BRIEF DESCRIPTION OF THE DRAWINGS

FIGS. 9A and 9B show operation of the NMOS transistor in FIG. 5 in an ON state and an OFF state, respectively.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

High-speed high-power semiconductor devices are described herein. These semiconductor devices may be operated as transistors. Hence, the terms "semiconductor device", "transistor", and "MOS transistor" are used interchangeably herein. The high-speed high-power semiconductor devices may be fabricated in standard CMOS processes and may have various desirable characteristics such as a high breakdown voltage and a high operating speed. These semiconductor devices may be suitable for use in high-speed RF power amplifiers, power management integrated circuits (PMICs), switches, codecs, and other active circuits requiring high speed and/or high output power.

Figure 1:
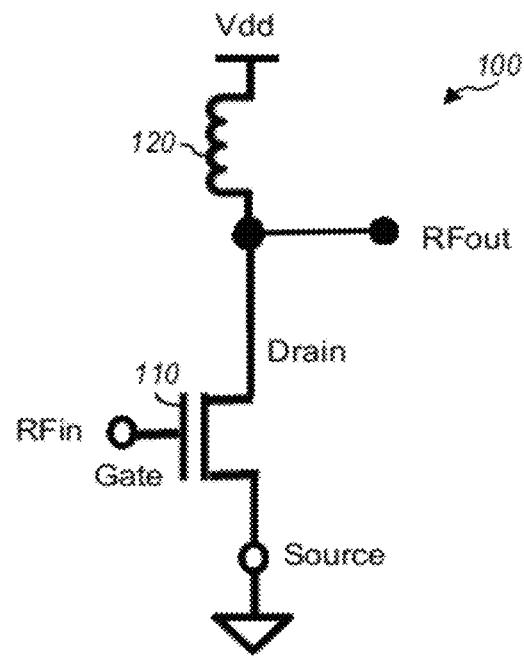
FIG. 1 shows a schematic diagram of a power amplifier.

FIG. 1 shows a schematic diagram of an exemplary design of a power amplifier 100 implemented with a single N-channel metal oxide semiconductor (NMOS) transistor 110. NMOS transistor 110 has its gate receiving an input RF signal (RFin), its source coupled to circuit ground, and its drain providing an output RF signal (RFout). An inductor 120 has one end coupled to a power supply (Vdd) and the other end coupled to the drain of NMOS transistor 110. The Vdd supply may be a battery supply or some other power supply.

Power amplifier 100 may also include other circuits not shown in FIG. 1. For example, power amplifier 100 may include an input impedance matching circuit having one end receiving the RFin signal and the other end coupled to the gate of NMOS transistor 110. This matching circuit may perform input impedance matching for power amplifier 100. Power amplifier 100 may also include an output impedance matching circuit having one end coupled to the drain of NMOS transistor 110 and the other end providing the RFout signal. This matching circuit may perform output impedance matching for power amplifier 100.

Figure 2:
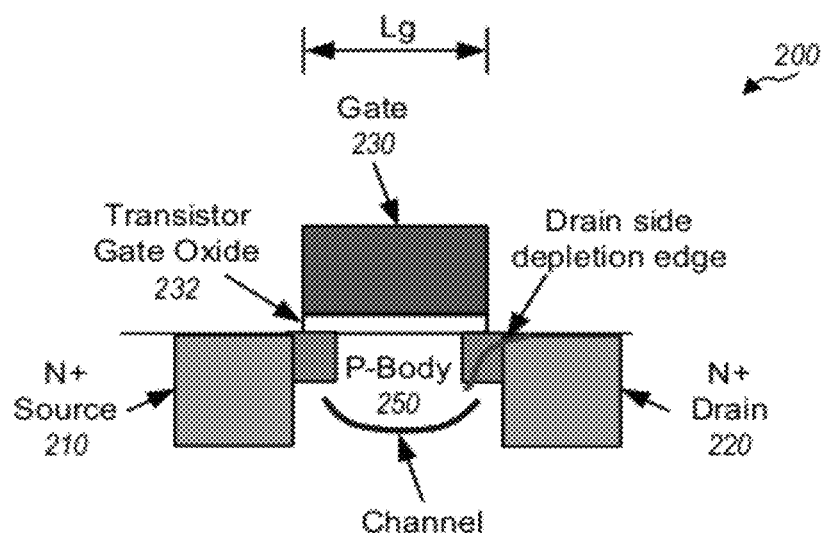
FIG. 2 shows a conventional N-channel MOS (NMOS) transistor.

FIG. 2 shows a cross-sectional view of an NMOS transistor 200 fabricated with a CMOS process. NMOS transistor 200 includes a source formed by an N+ region 210, a drain formed by an N+ region 220, and a gate formed by a poly region 230. A P-type well (or P-body) 250 is formed between source region 210 and drain region 220. A transistor gate oxide 232 is formed between gate region 230 and P-body 250. A channel may be formed between source region 210 and drain region 220 by applying the proper voltage at gate region 230.

NMOS transistor 200 may be used for a power amplifier. For example, NMOS transistor 200 may be used for NMOS transistor 110 in power amplifier 100 in FIG. 1. The maximum output power ($P_{max}$) and the efficiency ($\eta$) of the power amplifier may be expressed as:

$$P_{max} = \frac{V_{bd}^2}{R_{on}}, \text{ and} \qquad \text{Eq (1)}$$

$$\eta = \frac{\eta_{max} \cdot R_{load}}{R_{load} + \lambda \cdot R_{on}}, \qquad \text{Eq (2)}$$

where $V_{bd}$ is the breakdown voltage of NMOS transistor 200, $R_{on}$ is the resistance of NMOS transistor 200 when it is turned on, $\eta_{max}$ is the maximum efficiency of NMOS transistor 200, and $R_{load}$ is the load resistance of the power amplifier.

As shown in equations (1) and (2), a higher $P_{max}$ and a higher efficiency may be obtained for the power amplifier by reducing $R_{on}$ and increasing $V_{bd}$. For a standard CMOS process, the length of the gate (Lg) and the thickness of the gate oxide (TOX) may be scaled together to obtain the desired transistor characteristics. Reducing both Lg and TOX results in a lower $R_{on}$ but also a lower $V_{bd}$. Hence, it is difficult to obtain both a low $R_{on}$ and a high $V_{bd}$ with a standard CMOS process.

NMOS transistor 200 may have additional drawbacks. First, thin transistor gate oxide 232 and high doping of drain region 220 may result in a high electric field at the gate-drain edge or boundary. This may limit the drain-to-gate voltage ($V_{dg}$) of NMOS transistor 200. Second, the short channel between the source and drain results in susceptibility to punch-through, which may limit the drain-to-source voltage ($V_{ds}$) of NMOS transistor 200.

In an aspect, a high-speed high-power MOS transistor with a low $R_{on}$ and a high $V_{bd}$ may be obtained by (i) extending the drain so that it is located farther away from the source, (ii) adding one or more "field" gates next to an "active" gate, and (iii) forming a number of alternating shallow trench isolation (STI) strips and drain active strips between the active gate and the drain. The active gate receives an input signal and controls the MOS transistor. The one or more field gates may be self-biased to control the operation of the MOS transistor. These various features of the MOS transistor are described in further detail below.

A high-speed high-power MOS transistor may be fabricated with various IC process technologies. For example, a high-speed high-power MOS transistor may be fabricated with a silicon-on-insulator (SOI) IC process, which is an IC process in which a thin layer of silicon is formed on top of an insulator such as silicon oxide or glass. A MOS transistor may then be fabricated on top of this thin layer of silicon within its own isolated oxide tub formed by a buried oxide layer (BOX) underneath and STI walls on the four sides. The BOX and STI walls block leakage and reduce parasitic capacitance, which may allow the MOS transistor to operate at a higher frequency and/or have better efficiency. A high-speed high-power MOS transistor may also be fabricated with a standard bulk CMOS process.

Figure 3:
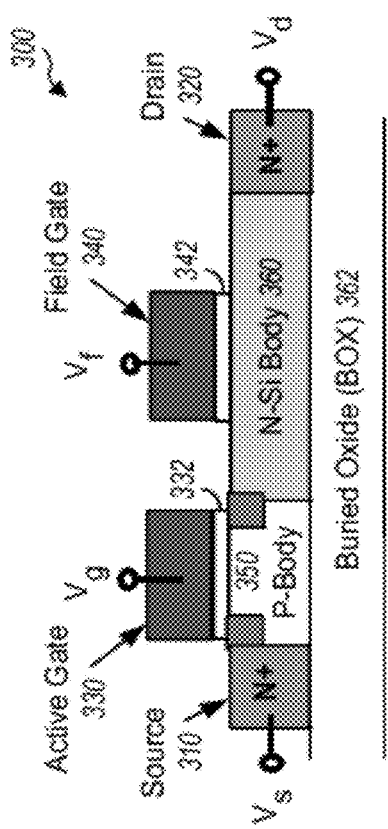
FIG. 3 shows a high-speed high-power NMOS transistor.

FIG. 3 shows a cross-sectional view of an exemplary design of a high-speed high-power NMOS transistor 300 fabricated with a SOI IC process. NMOS transistor 300 includes an N+ source 310, an N+ drain 320, an active gate 330, a transistor gate oxide 332, and a P-body 350 under active gate 330. Drain 320 is extended and located farther away from source 310 in NMOS transistor 300 than in NMOS transistor 200 in FIG. 2. An N—Si body 360 is formed between P-body 350 and drain 320. A field gate 340 is formed next to active gate 330 and over N—Si body 360. Field gate 340 is located between active gate 330 and drain 320. A transistor gate oxide 342 is formed between field gate 340 and N—Si body 360. All of the components of NMOS transistor 300 are formed over a buried oxide layer (BOX) 362.

A voltage of $V_g$ may be applied to active gate 330 and a voltage of $V_f$ may be applied to field gate 340 to control the operation of NMOS transistor 300. A voltage of $V_s$ may be presented to source 310, and a voltage of $V_d$ may be provided by drain 320.

Figure 4:
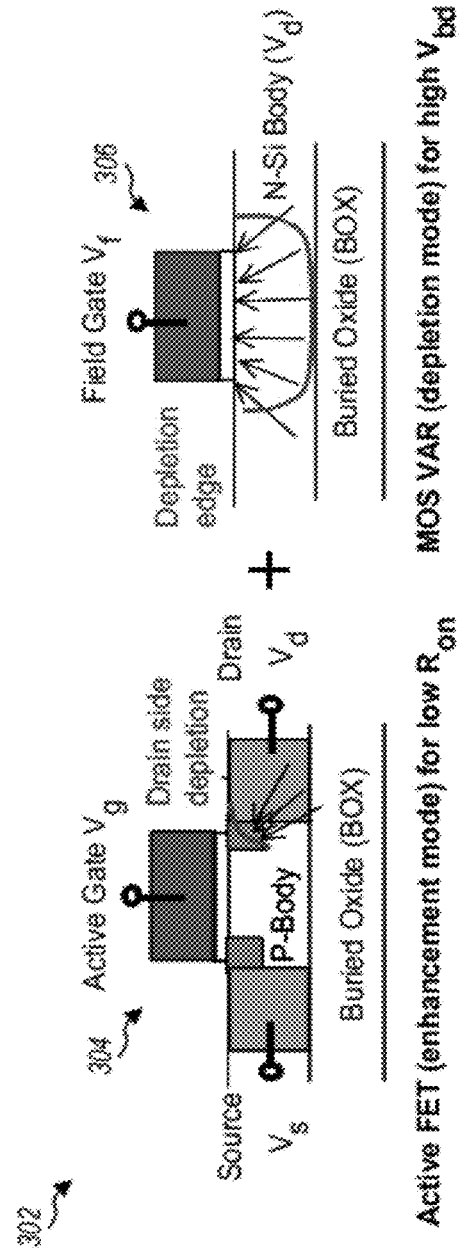
FIG. 4 shows a model of the high-speed high-power NMOS transistor in FIG. 3.

FIG. 4 shows a cross-sectional view of a model 302 of high-speed high-power NMOS transistor 300 in FIG. 3. NMOS transistor 300 may be viewed as being composed of (i) an active field effect transistor (FET) 304 operating in an enhancement mode and (ii) a MOS varactor 306 operating in a depletion mode. Active FET 304 has a low $R_{on}$. MOS varactor 306 includes the field gate and has a high $V_{bd}$ and a high drain voltage. The combination of active FET 304 and MOS varactor 306 can provide both a low $R_{on}$ and a high $V_{bd}$.

Figure 5:
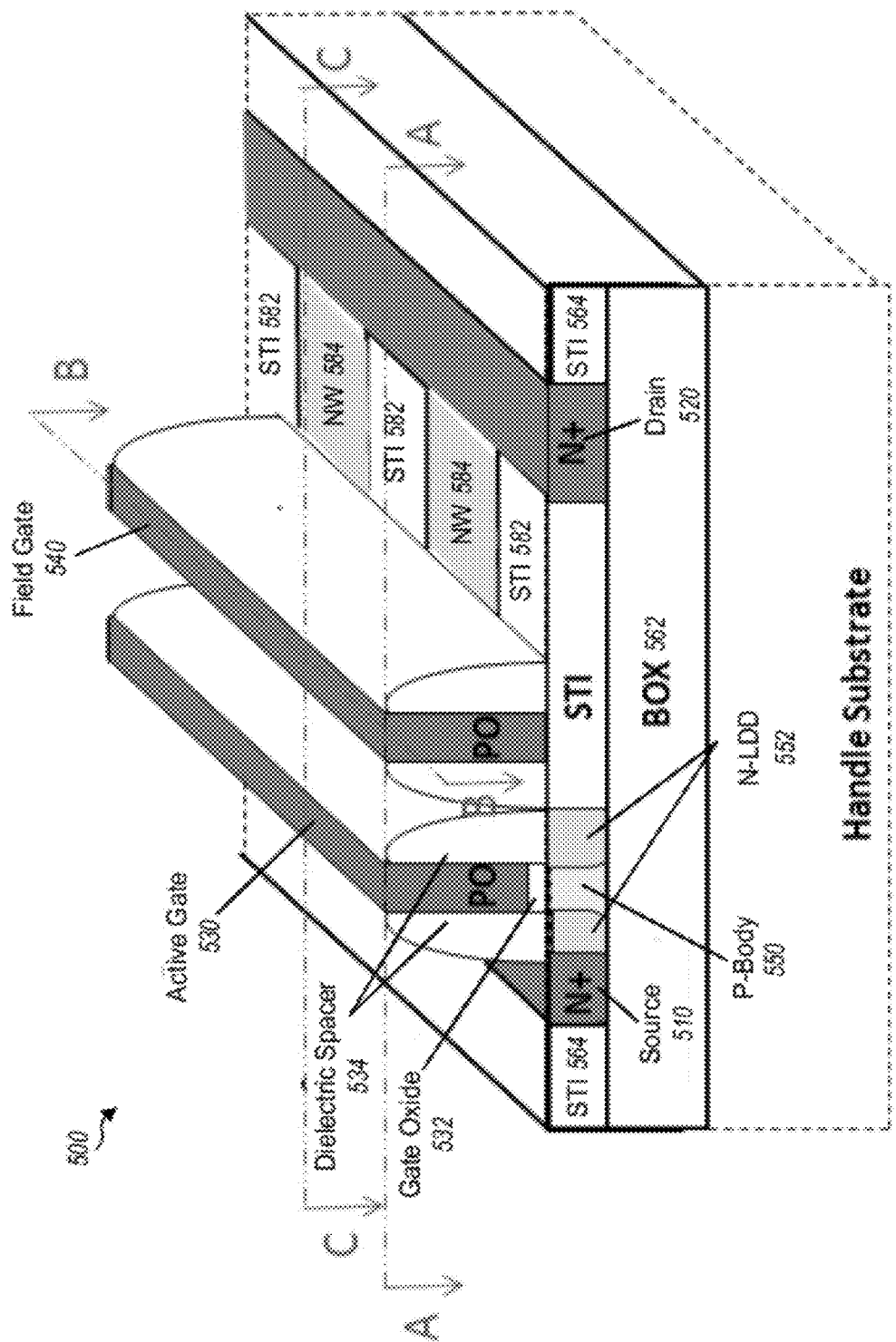
FIG. 5 shows a high-speed high-power NMOS transistor fabricated with a silicon-on-insulator (SOI) IC process.

FIG. 5 shows a 3-dimensional (3D) view of an exemplary design of a high-speed high-power NMOS transistor 500 fabricated with a SOI IC process. NMOS transistor 500 may also be referred to as a SOI NMOS Drain Depletion Enhanced Transistor (n-DDET).

NMOS transistor 500 includes an N+ source 510, an N+ drain 520, a poly (PO) active gate 530, and a poly field gate 540, which may be formed as shown in FIG. 5. Active gate 530 and field gate 540 are formed parallel with source 510 and drain 520. Dielectric spacers 534 are formed on both sides of active gate 530 and also on both sides of field gate 540. Alternating STI strips 582 and drain active strips 584 (which are labeled as "NW" in FIG. 5) are formed transverse to source 510, drain 520, and gates 530 and 540 of NMOS transistor 500. A P-body 550 is formed over a buried oxide (BOX) layer 562 and under active gate 530. N-type lightly doped diffusion (N-LDD) regions 552 are formed on both sides of P-body 550. A transistor gate oxide 532 is formed between active gate 530 and P-body 550. BOX 562 and STI walls 564 form an isolated oxide tub for NMOS transistor 500.

As shown in FIG. 5, NMOS transistor 500 may include a vertical field gate 540 and lateral STI field effect. NMOS transistor 500 may be fabricated with standard CMOS layers and process flow. Minimum channel length and small device layout/footprint may be achievable for NMOS transistor 500.

Figure 6:
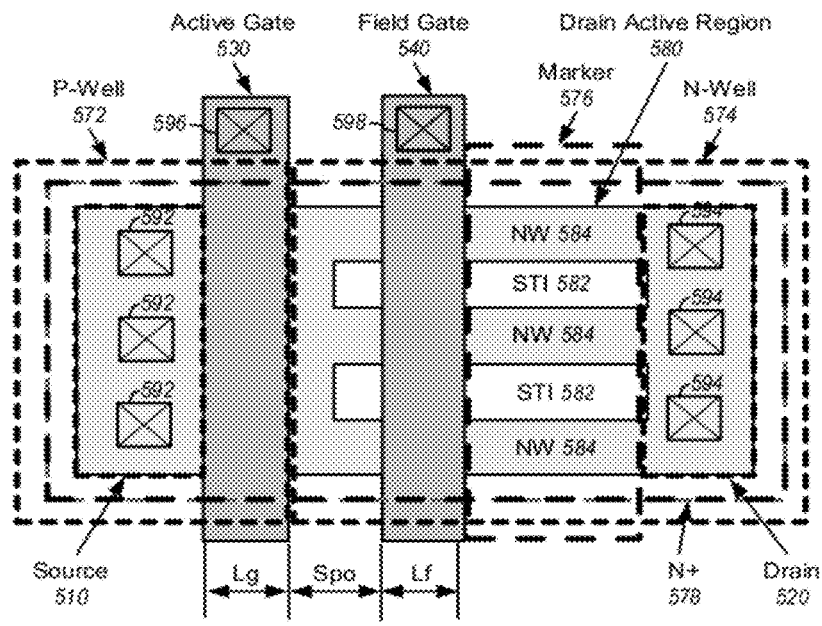
FIG. 6 shows a top view of the NMOS transistor in FIG. 5.

FIG. 6 shows a top view and layout design of high-speed high-power NMOS transistor 500 in FIG. 5. NMOS transistor 500 is formed within an isolated oxide tub, which is formed by BOX 562 and STI strips on four sides, as shown in FIG. 5. A P-type well (P-well) 572 is formed on one side of the isolated oxide tub, and an N-type well (N-well) 574 is formed on the other side of the isolated oxide tub. P-body 550 (not shown in FIG. 6) is formed under active gate 530 within P-well 572. STI strips 582 are formed within a drain active region 580, which is inside of N-well 574, such that alternating STI strips 582 and drain active strips 584 are obtained.

An N+ region 578 is formed within the isolated oxide tub. Source 510 is formed on one side of N+ region 578, and drain 520 is formed on the other side of N+ region 578. A marker 576 is used to prevent N+ implant and silicidation between field gate 540 and drain 520 inside the marker area. Marker 576 may prevent drain metallization, which may short circuit the drain to the field gate depletion, and may therefore increase the breakdown voltage. The width of marker 576 may be selected based on a breakdown voltage rating. Contacts 592 are formed over source 510, contacts 594 are formed over drain 520, a contact 596 is formed over active gate 530, and a contact 598 is formed over field gate 540.

As shown in FIG. 6, the active gate has a length of Lg, the field gate has a length of Lf, and the spacing between the active gate and the field gate is Spo. The gate length includes only the poly and not the dielectric spacers on both sides of the poly. In an exemplary design, the field gate length is equal to or greater than the active gate length, or Lf≥Lg. The active gate and the field gate should be located close in proximity. In an exemplary design, the spacing between the active gate and the field gate is less than twice the minimum poly spacing. Other values may also be used for the field gate length Lf and the spacing Spo. The layout design for NMOS transistor 500 uses standard CMOS mask layers and hence does not incur added mask cost.

Figure 7A:
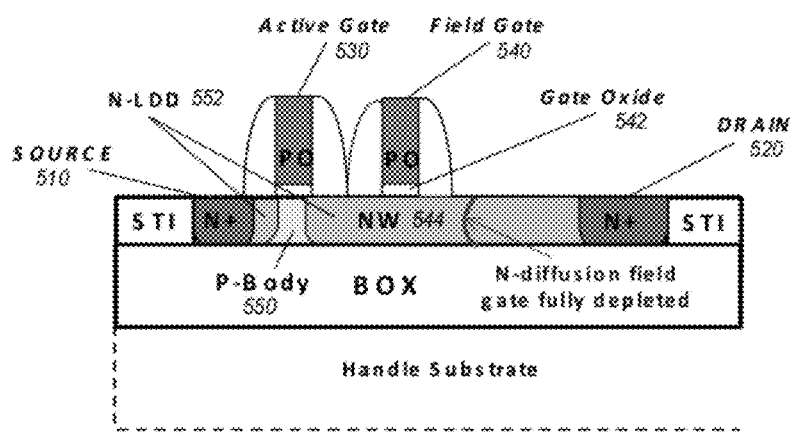
FIGS. 7A, 7B and 7C show cross-sectional views of the NMOS transistor in FIG. 5 along different lines.

FIG. 7A shows a cross-sectional view of NMOS transistor 500 in FIG. 5 along line C-C, which runs along the center of one drain active strip 584 in FIG. 5. In this view, an N-well (NW) 544 is formed from N-LDD region 552 to drain 520 by drain active strip 584. Field gate 540 is isolated from N-well 544 by a transistor gate oxide 542 formed under field gate 540. A conduction path can be formed between drain 520 and source 510 via N-LDD regions 552 and N-well 544 when P-body 550 under active gate 530 is inverted.

Figure 7B:
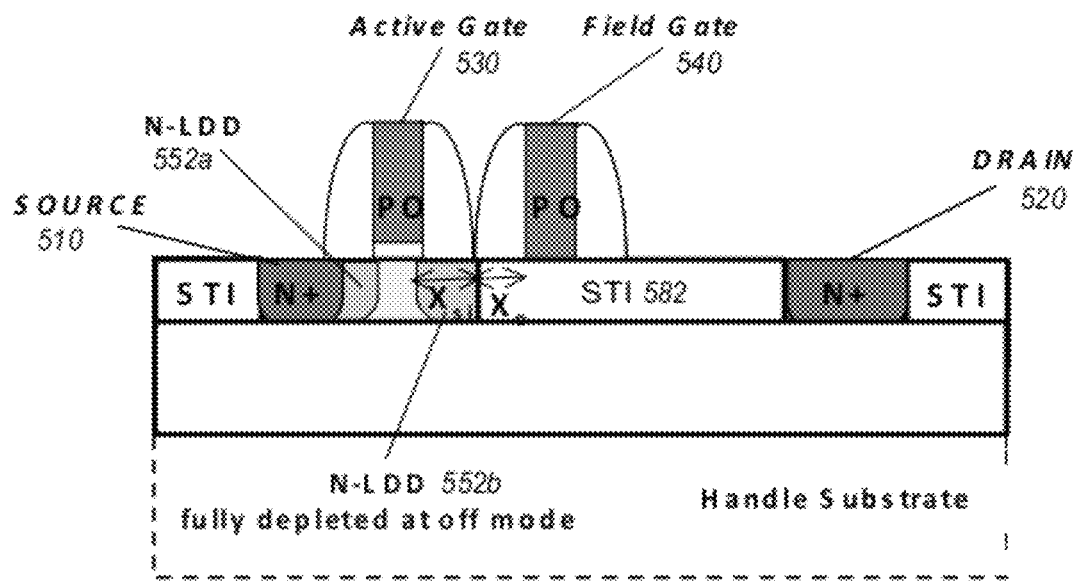

FIG. 7B shows a cross-sectional view of NMOS transistor 500 in FIG. 5 along line A-A, which runs along the center of one STI strip 582 in FIG. 5. In this view, field gate 540 is formed over STI strip 582.

Figure 7C:
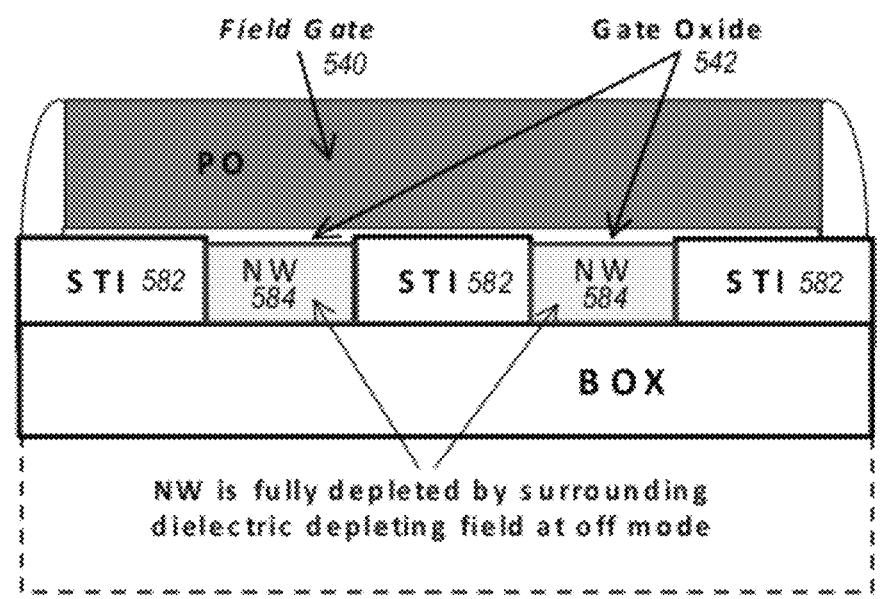

FIG. 7C shows a cross-sectional view of NMOS transistor 500 in FIG. 5 along line B-B, which runs along the center of field gate 540 in FIG. 5. This view shows STI strips 582 alternating with drain active strips 584. Field gate 540 is formed over and transverse to STI strips 582 and drain active strips 584. Gate oxide 542 isolates field gate 540 from drain active strips 584. STI strips 582 increase charge depletion in drain active strips 584 during high voltage operation.

Figure 8:
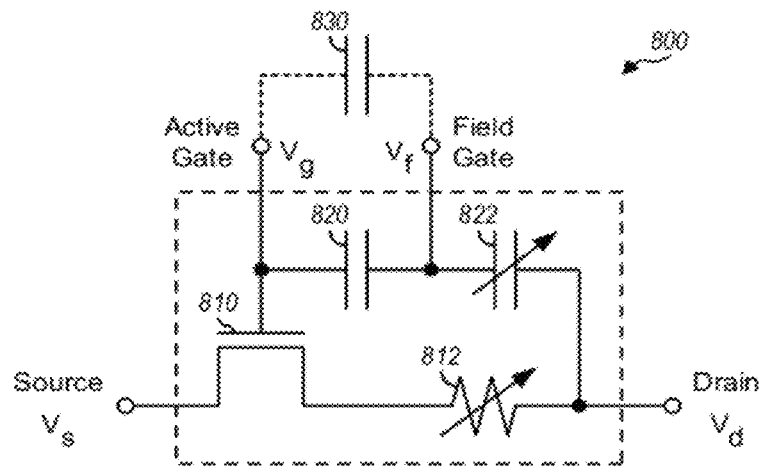
FIG. 8 shows a schematic diagram of a model of the NMOS transistor in FIG. 5.

FIG. 8 shows a schematic diagram of a model 800 of NMOS transistor 500 in FIG. 5. Model 800 includes four nodes for the source ($V_s$), the drain ($V_d$), the active gate ($V_g$), and the field gate ($V_f$) of NMOS transistor 500. NMOS transistor 500 may be modeled with an active FET 810 having a source acting as the $V_s$ node and a gate acting as the $V_g$ node. A variable resistor 812 is coupled to the drain of active FET 810 and the $V_d$ node. A variable capacitor 822 is coupled between the $V_f$ node and the $V_d$ node and results from fringing between the field gate and the drain active depletion. More depletion at higher drain voltage results in a lower capacitance of variable capacitor 822, a higher resistance of variable resistor 812, and a higher voltage blocking capability. A capacitor 820 is coupled between the $V_g$ node and the $V_f$ node and results from fringing between the active gate and the field gate. Capacitors 820 and 822 are parasitic capacitors of NMOS transistor 500 and form a voltage divider between the $V_g$ node and the $V_d$ node. An external capacitor 830 may have one end coupled to the $V_f$ node and the other end coupled to the $V_g$ node (as shown in FIG. 8), the $V_s$ node, or the $V_d$ node. Capacitor 830 may be used to properly set the voltage at the field gate. Other voltage divider circuits, such as a resistor ladder, may also be used to set the voltage at the $V_f$ node.

In an exemplary configuration, an input RF signal may be applied to the active gate of NMOS transistor 500, which is the gate of active FET 810. The voltage on the field gate is determined by a voltage divider formed by capacitors 820 and 822.

A gate voltage of 0 Volts may be applied to active gate 530 of NMOS transistor 500 in an OFF state. In this case, the voltage ($V_f$) at field gate 540 may be expressed as:

$$V_f = \frac{C_{fd}}{C_{f1} + C_{fd}} \cdot V_d, \qquad \text{Eq (3)}$$

where $C_{f1}$ is the capacitance of capacitor 820,
$C_{fd}$ is the capacitance of capacitor 822, and
$V_d$ is the drain voltage of NMOS transistor 500.

As shown in equation (3), the $V_f$ voltage at field gate 540 is a fraction of the drain voltage, with the fraction being dependent on the values of capacitors 820 and 822. Equation (3) assumes that capacitor 830 is not present. The drain voltage may be distributed across field gate 540 by selecting suitable values of capacitors 820, 822 and/or 830.

NMOS transistor 500 in FIG. 5 can achieve high speed and high power by creating (i) a lightly doped drain active region 580, (ii) dielectric STI strips 582 within active drain region 580 to form drain active strips 584, and (iii) field gate 540 over drain active region 580 and dielectric STI strips 582. STI strips 582, drain active strips 584, and field gate 540 form a 3-D depletion field clamp.

FIG. 9A shows operation of NMOS transistor 500 in FIG. 5 when it is turned on, e.g., by applying a sufficiently high voltage to the active gate. For example, the gate voltage at active gate 530 may be set to the drain voltage, so that $V_g = V_f = V_d$. In the ON state, an inversion channel is formed under the active gate. The field gate is self-biased such that it creates a highly conductive drain active region underneath and therefore conserves transistor on-conductance. The drain active strips under the field gate form an accumulation conducting layer under the thin gate oxide below the field gate, which supports a low $R_{on}$.

FIG. 9B shows operation of NMOS transistor 500 in FIG. 5 when it is turned off, e.g., by applying 0V to the active gate and the source of NMOS transistor 500. In the OFF state, the N-diffusion region under the active gate is fully depleted, and no inversion channel is present under the active gate. A negative potential of $V_f - V_d$ over the thin gate oxide under the field gate and the STI strips results in a fully depleted N-well region. The drain active region under the field gate is at strong depletion (or pinch off). This protects the active gate from seeing a high voltage and supports a high Vdd. The 3-D field depletion clamp substantially reduces the electrical field seen at the gate/drain edge and redistributes the voltage drop across the drain active strips. This allows a substantially higher voltage to be present at the drain, thereby providing a high breakdown voltage for NMOS transistor 500.

For simplicity, the description above is for a case in which one field gate is present. In general, a high $V_{bd}$ may be obtained by (i) moving the drain farther away from the source and (ii) forming one or more field gates close to the active gate and between the drain and the source. The field gate(s) may be self-biased. A number of STI strips may be formed in the extended drain active region and under the one or more field gates.

Figure 10:
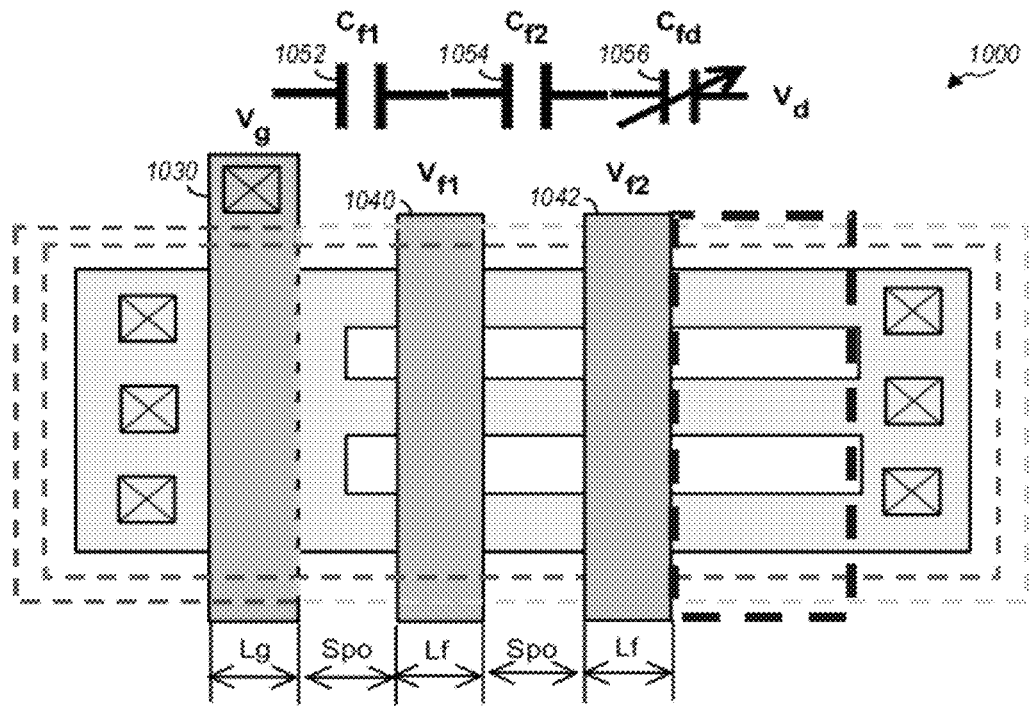
FIG. 10 shows a high-speed high-power NMOS transistor with two field gates.

FIG. 10 shows a top view of an exemplary design of a high-speed high-power NMOS transistor 1000 with an active gate 1030 and two field gates 1040 and 1042. The two field gates may have the same length of Lf (as shown in FIG. 10) or different lengths. Field gate 1040 may be located at a distance of Spo from active gate 1030. Field gate 1042 may be located at the same distance of Spo from field gate 1040 (as shown in FIG. 10) or at a different distance from field gate 1040.

FIG. 10 also shows various parasitic capacitors of NMOS transistor 1000. A parasitic capacitor 1052 with a value of $C_{f1}$ is located between active gate 1030 and field gate 1040. A parasitic capacitor 1054 with a value of $C_{f2}$ is located between the two field gates 1040 and 1042. A parasitic capacitor 1056 with a value of $C_{fd}$ is located between field gate 1042 and the drain.

A gate voltage of 0 Volts may be applied to active gate 1030 of NMOS transistor 1000 in an OFF state. In this case, the voltage ($V_{f1}$) at field gate 1040 and the voltage ($V_{f2}$) at field gate 1042 may be expressed as:

$$V_{f1} = \frac{k}{1+2k} \cdot V_d, \text{ and} \qquad \text{Eq (4)}$$

$$V_{f2} = 2V_{f1}, \qquad \text{Eq (5)}$$

where $C_{f1}=C_{f2}=C_0$, $C_{fd}=C_s$, $k=C_s/C_0$, and $V_d$ is the drain voltage of NMOS transistor 1000.

As shown in equations (4) and (5), the $V_{f1}$ voltage at field gate 1040 is less than half of the drain voltage, and the $V_{f2}$ voltage at field gate 1042 is between the $V_{f1}$ voltage and the drain voltage. In general, the drain voltage may be distributed across any number of field gates. The number of field gates may be selected based on the expected maximum drain voltage. More field gates may be used to increase the breakdown voltage (and hence handle a higher maximum drain voltage) by splitting the drain voltage drop under each field gate region.

Figure 11:
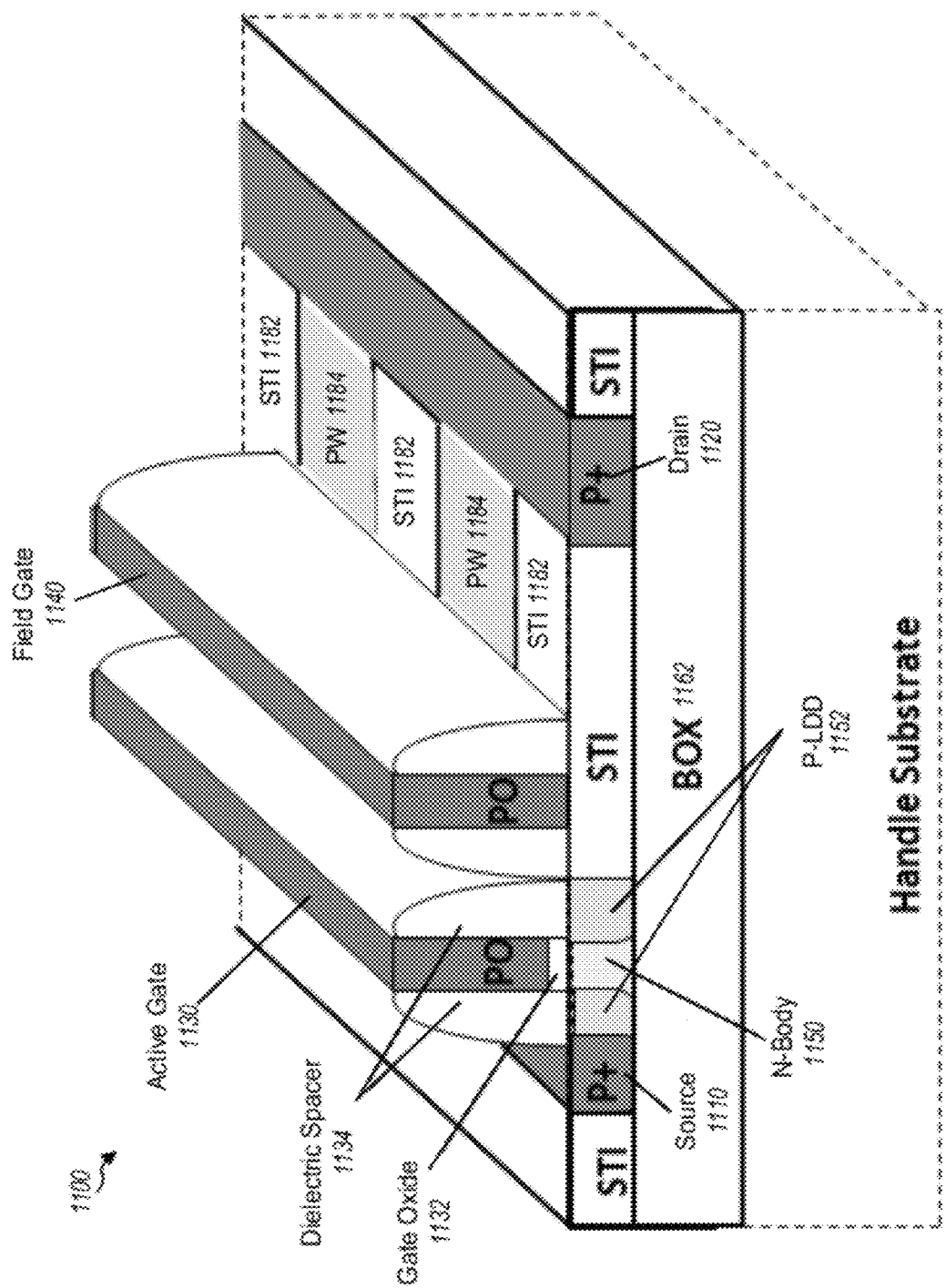
FIG. 11 shows a high-speed high-power P-channel MOS (PMOS) transistor fabricated with a SOI IC process.

FIG. 11 shows a 3D view of an exemplary design of a high-speed high-power P-channel MOS (PMOS) transistor 1100 fabricated with a SOI IC process. PMOS transistor 1100 may also be referred to as a SOI PMOS Drain Depletion Enhanced Transistor (p-DDET). PMOS transistor 1100 includes a P+ source 1110, a P+ drain 1120, an active gate 1130, and a field gate 1140, which may be formed as shown in FIG. 11. Active gate 1130 and field gate 1140 are formed parallel with source 1110 and drain 1120. Dielectric spacers 1134 are formed on both sides of active gate 1130 and also on both sides of field gate 1140. An N-body 1150 is formed over a buried oxide (BOX) layer 1162 and under active gate 1130. A transistor gate oxide 1132 is formed between active gate 1130 and N-body 1150. P-type lightly doped diffusion (P-LDD) regions 1152 are formed on both sides of N-body 1150. Alternating STI strips 1182 and drain active strips 1184 (which are labeled as "PW" in FIG. 11) are formed transverse to source 1110, drain 1120, and gates 1130 and 1140 of PMOS transistor 1100.

As shown in FIGS. 5 and 11, PMOS transistor 1100 may be obtained by (i) replacing N-type diffusion in NMOS transistor 500 with P-type diffusion in PMOS transistor 1100, (ii) replacing P-body 550 in NMOS transistor 500 with N-body 1150 in PMOS transistor 1100, and (iii) replacing N-LDD regions 552 in NMOS transistor 500 with P-LDD regions 1152 in PMOS transistor 1100. Operation principles and layout design features for PMOS transistor 1100 may be similar to those of NMOS transistor 500, albeit with inversed polarity.

Figure 12:
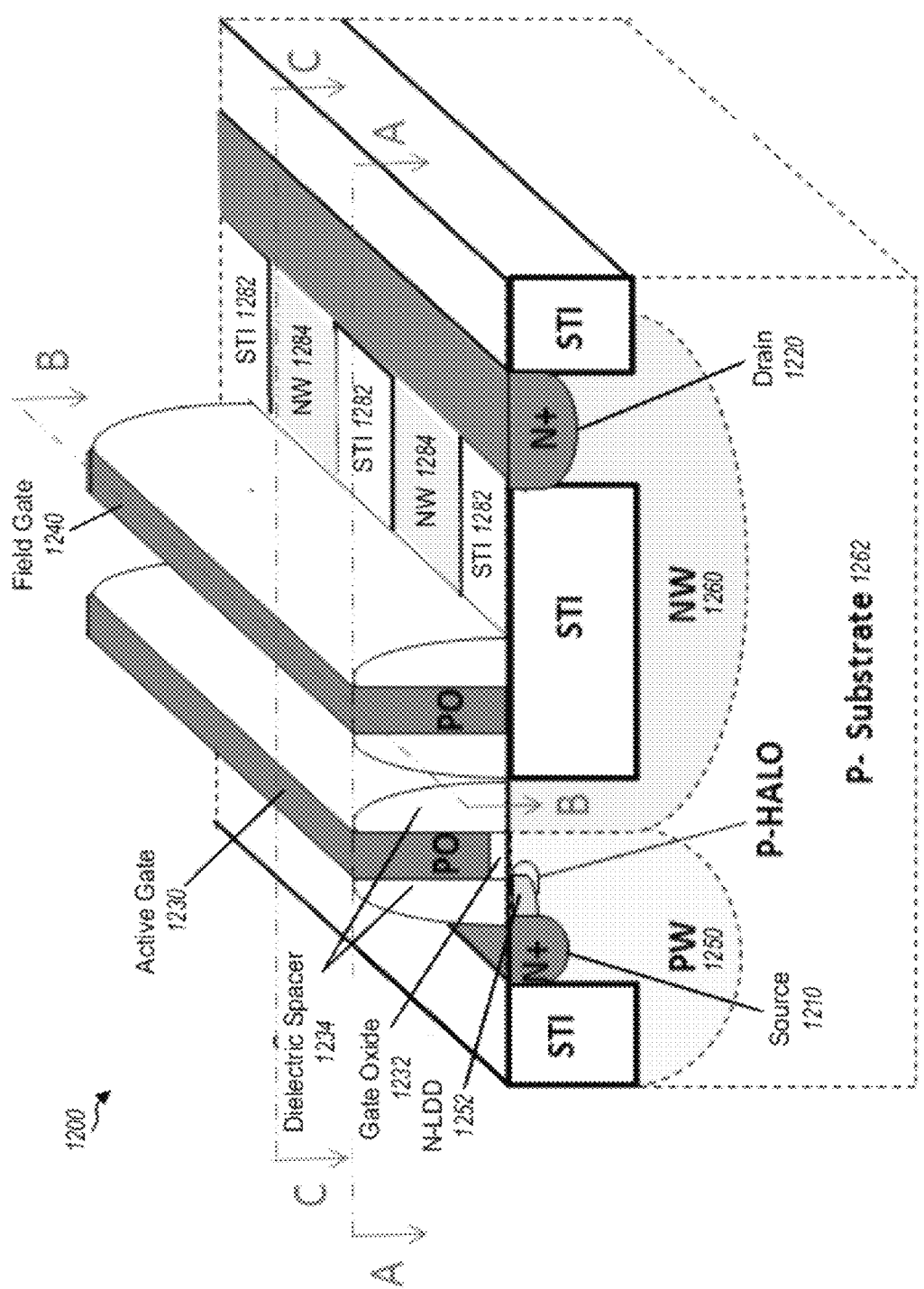
FIG. 12 shows a high-speed high-power NMOS transistor fabricated with a standard bulk CMOS process.

FIG. 12 shows a 3D view of an exemplary design of a high-speed high-power NMOS transistor 1200 fabricated with a standard bulk CMOS process. NMOS transistor 1200 may also be referred to as a bulk n-DDET. NMOS transistor 1200 includes an N+ source 1210, an N+ drain 1220, an active gate 1230, and a field gate 1240, which may be formed as shown in FIG. 12. Active gate 1230 and field gate 1240 are formed parallel with source 1210 and drain 1220. Dielectric spacers 1234 are formed on both sides of active gate 1230 and also on both sides of field gate 1240. A P-type well (PW) 1250 is formed under active gate 1230 and over a P-type substrate 1262. An N-type well (NW) 1260 is formed under field gate 1240 and operate as a drain active region for NMOS transistor 1200. A transistor gate oxide 1232 is formed between active gate 1230 and P-well 1250. An N-LDD region 1252 is formed next to source 1210 and under dielectric spacer 1234 for active gate 1230. Alternating STI strips 1282 and drain active strips 1284 are formed transverse to source 1210, drain 1220, and gates 1230 and 1240 of NMOS transistor 1200.

Figure 13:
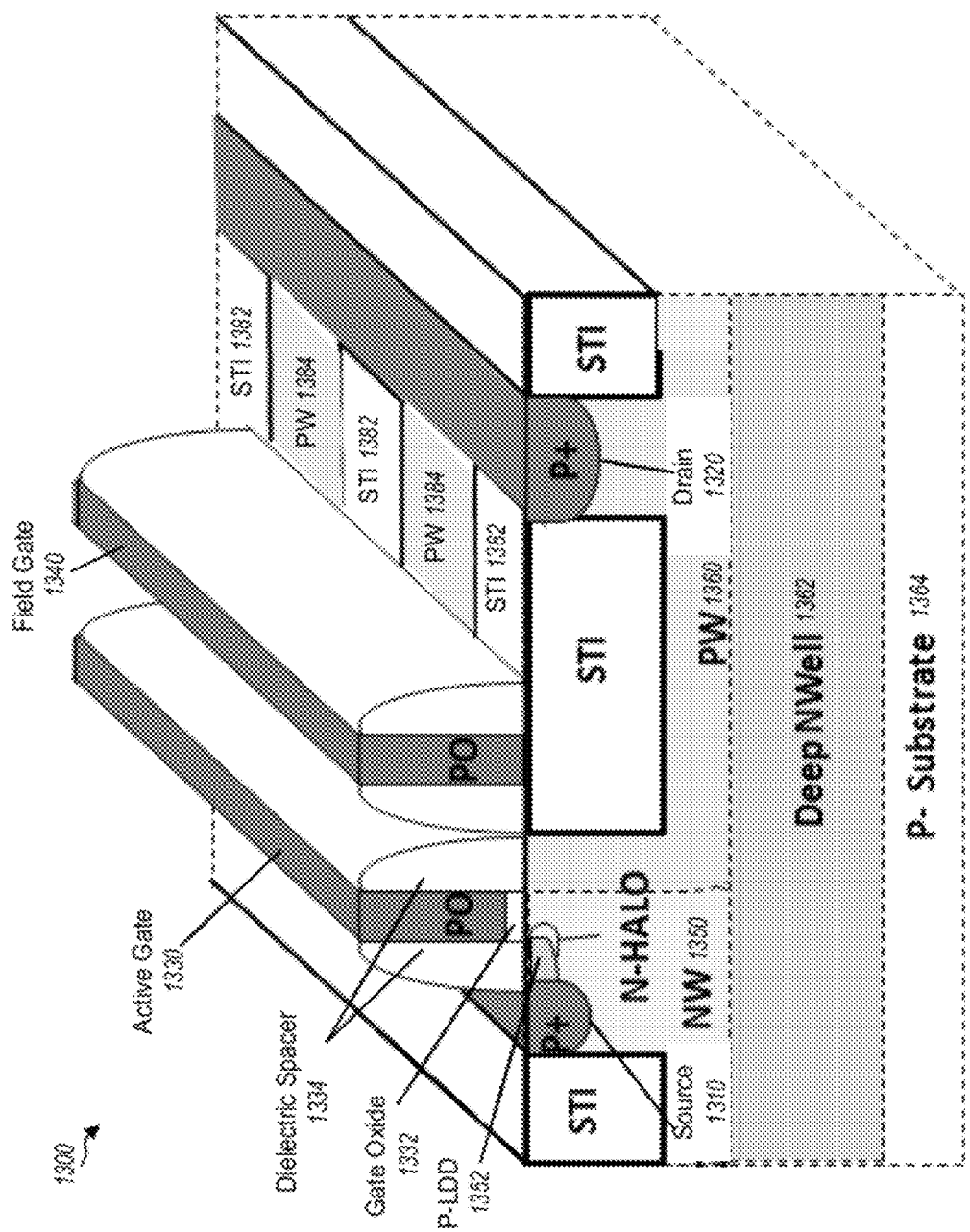
FIG. 13 shows a high-speed high-power PMOS transistor fabricated with a standard bulk CMOS process.

FIG. 13 shows a 3D view of an exemplary design of a high-speed high-power PMOS transistor 1300 fabricated with a standard bulk CMOS process. PMOS transistor 1300 may also be referred to as a bulk p-DDET. PMOS transistor 1300 includes a P+ source 1310, a P+ drain 1320, an active gate 1330, and a field gate 1340, which may be formed as shown in FIG. 13. Active gate 1330 and field gate 1340 are formed parallel with source 1310 and drain 1320. Dielectric spacers 1334 are formed on both sides of active gate 1330 and also on both sides of field gate 1340. An N-type well 1350 is formed under active gate 1330, and a P-type well 1360 is formed under field gate 1340. N-type well 1350 and P-type well 1360 are formed over a deep N-type well 1362, which is formed over a P-type substrate 1364. N-type well (N-Well) 1362 provides a guard ring for isolation. A transistor gate oxide 1332 is formed between active gate 1330 and N-well 1350. A P-LDD region 1352 is formed next to source 1310 and under dielectric spacer 1334 for active gate 1330. Alternating STI strips 1382 and drain active strips 1384 are formed transverse to source 1310, drain 1320, and gates 1330 and 1340 of PMOS transistor 1300.

As shown in FIGS. 12 and 13, operation principles and layout design features for PMOS transistor 1300 may be similar to those of NMOS transistor 1200, albeit with inversed polarity. NMOS transistor 1200 and PMOS transistor 1300 may be fabricated using standard CMOS layers and process flow. Minimum channel length and small device layout/footprint may be achievable for NMOS transistor 1200 and PMOS transistor 1300.

The high-speed high-power MOS transistors described herein may have various advantages. First, these MOS transistors may have higher power/voltage and higher speed than standard MOS transistors. Second, these MOS transistors may be implemented in a compact layout. Third, these MOS transistors may enable a power amplifier to be designed with a single transistor, which may avoid higher complexity and lower efficiency often associated with a power amplifier implemented with stacked transistors. Fourth, these MOS transistors may be fabricated with layers and IC process steps that are compatible with standard CMOS process flow, thereby taking advantage of CMOS self-alignment and channel scaling capability without adding masks and/or complicated IC process steps. These MOS transistors may thus be fabricated on and integrated with compact CMOS logic ICs. Fifth, these MOS transistors may enable a compact power amplifier cell design with no added masks or IC process steps, which may be more cost effective. Sixth, these MOS transistors may be fabricated with both SOI and bulk CMOS processes without extensive customization from one IC process technology to another. Other advantages may also be obtained with these MOS transistors. In general, these MOS transistors may be smaller and cheaper and may also have better performance than conventional MOS transistors.

The high-speed high-power MOS transistors described herein may be used for power amplifiers and other active circuits. Some exemplary circuits in which these MOS transistors may be used are described below.

Figure 14:
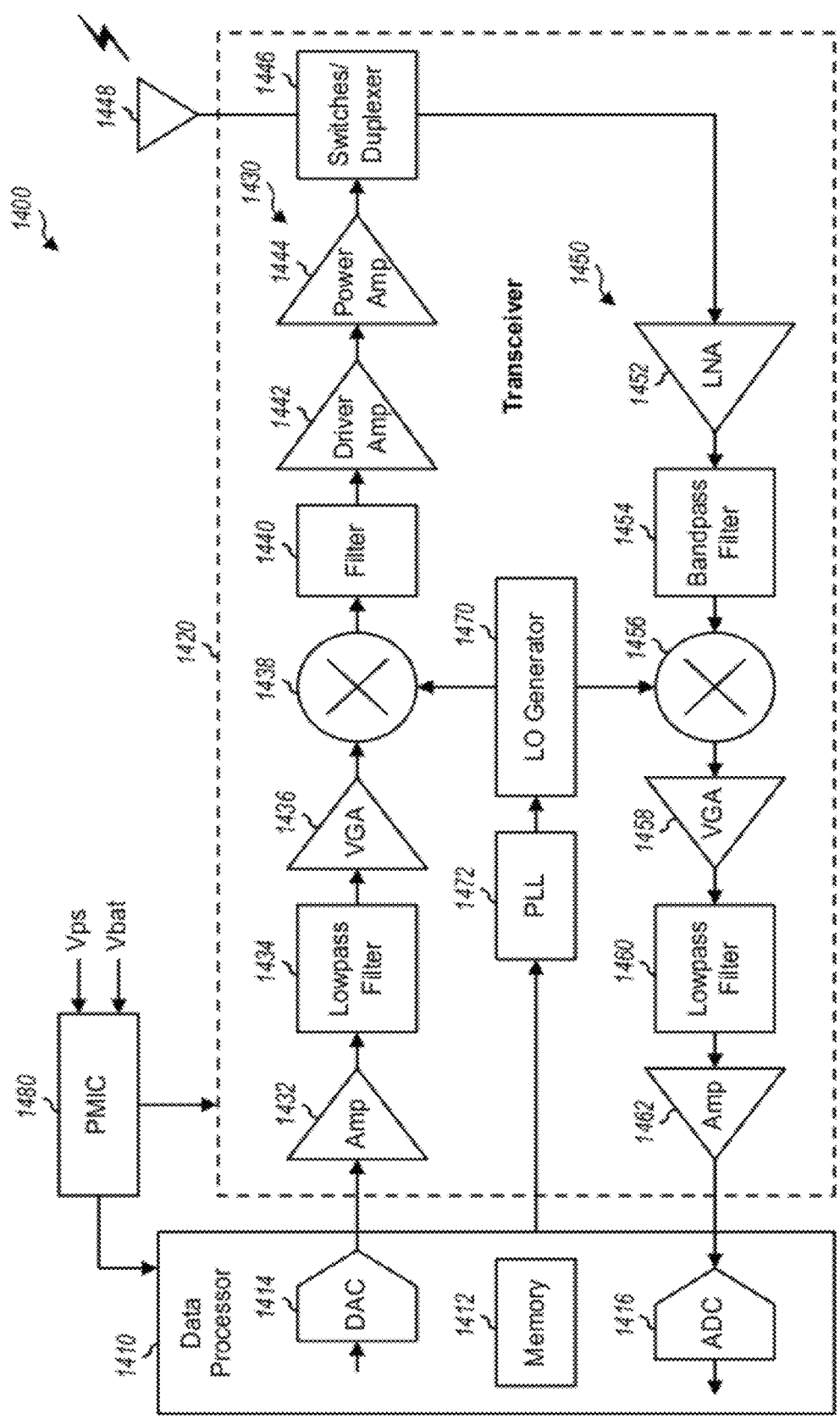
FIG. 14 shows a block diagram of a wireless communication device.

FIG. 14 shows a block diagram of an exemplary design of a wireless communication device 1400. In this exemplary design, wireless device 1400 includes a data processor 1410, a transceiver 1420, and a PMIC 1480. Transceiver 1420 includes a transmitter 1430 and a receiver 1450 that support bi-directional wireless communication. In general, wireless device 1400 may include any number of transmitters and any number of receivers for any number of communication systems, any number of frequency bands, and any number of antennas.

In the transmit path, data processor 1410 processes data to be transmitted. A digital-to-analog converter (DAC) 1414 receives the processed data and provides an analog output signal to transmitter 1430. Within transmitter 1430, the analog output signal is amplified by an amplifier (Amp) 1432, filtered by a lowpass filter 1434 to remove images caused by the digital-to-analog conversion, amplified by a variable gain amplifier (VGA) 1436, and upconverted from baseband to RF by an upconverter 1438. The upconverted signal is filtered by a filter 1440, further amplified by a driver amplifier 1442 and a power amplifier 1444, routed through switches/duplexer 1446, and transmitted via an antenna 1448.

In the receive path, antenna 1448 receives signals from base stations and/or other transmitter stations and provides a received signal, which is routed through switches/duplexer 1446 and provided to receiver 1450. Within receiver 1450, the received signal is amplified by a low noise amplifier (LNA) 1452, filtered by a bandpass filter 1454, and downconverted from RF to baseband by a downconverter 1456. The downconverted signal is amplified by a VGA 1458, filtered by a lowpass filter 1460, and amplified by an amplifier 1462 to obtain an analog input signal, which is provided to data processor 1410. An analog-to-digital converter (ADC) 1416 digitizes the analog input signal and provides samples for processing by data processor 1410.

FIG. 14 shows transmitter 1430 and receiver 1450 implementing a direct-conversion architecture, which frequency converts a signal between RF and baseband in one stage. Transmitter 1430 and/or receiver 1450 may also implement a super-heterodyne architecture, which frequency converts a signal between RF and baseband in multiple stages. A local oscillator (LO) generator 1470 generates and provides transmit and receive LO signals to upconverter 1438 and downconverter 1456, respectively. A phase locked loop (PLL) 1472 receives control information from data processor 1410 and provides control signals to LO generator 1470 to generate the transmit and receive LO signals at the proper frequencies. PMIC 1480 receives a battery voltage (Vbat) and/or a power supply voltage (Vps) and generates supply voltages for data processor 1410 and transceiver 1420.

FIG. 14 shows an exemplary transceiver design. In general, the conditioning of the signals in transmitter 1430 and receiver 1450 may be performed by one or more stages of amplifier, filter, mixer, etc. These circuits may be arranged differently from the configuration shown in FIG. 14. Furthermore, other circuits not shown in FIG. 14 may also be used in the transmitter and receiver. For example, matching circuits may be used to match various active circuits in FIG. 14. Some circuits in FIG. 14 may also be omitted. All or a portion of transceiver 1420 may be implemented on one or more analog ICs, RF ICs (RFICs), mixed-signal ICs, etc. For example, amplifier 1432 through power amplifier 1444 in transmitter 1430 may be implemented on an RFIC. Driver amplifier 1442 and power amplifier 1444 may also be implemented on another IC external to the RFIC.

The high-speed high-power MOS transistors described herein may be used for various active circuits within wireless device 1400. For example, these MOS transistors may be used for power amplifier 1444, driver amplifier 1442, LO generator 1470, DAC 1414, ADC 1416, PMIC 1470, etc.

In an exemplary design, an apparatus (e.g., an IC, a wireless device, etc.) may comprise a semiconductor device (e.g., a MOS transistor) comprising a source, a drain to provide an output signal, and an active gate to receive an input signal. The semiconductor device may further comprise at least one field gate (e.g., field gate 540 in FIG. 5) located between the active gate and the drain. The semiconductor device may also comprise (i) at least one STI strip (e.g., STI strips 582 in FIG. 5) formed transverse to the at least one field gate and (ii) at least one drain active strip (e.g., drain active strips 584 in FIG. 5) formed parallel to, and alternating with, the at least one STI strip. The semiconductor device may be modeled by a combination of an active FET and a MOS varactor, e.g., as shown in FIGS. 3 and 4. The active gate controls the active FET, and the at least one field gate controls the MOS varactor. The semiconductor device may have a low on resistance, which may be determined based on the input signal. The semiconductor device may also be able to handle high voltage due to the combination of the active FET and the MOS varactor.

In an exemplary design, the semiconductor device may comprise a single field gate, e.g., as shown in FIG. 6. In another exemplary design, the semiconductor device may comprise multiple field gates, e.g., as shown in FIG. 10. In an exemplary design, each field gate may have a length that is equal or greater than the length of the active gate. In an exemplary design, each field gate may be located less than or equal to twice the minimum poly spacing from the active gate or another field gate. In an exemplary design, each field gate may have a different voltage, which may be determined based on a first voltage at the active gate and a second voltage at the drain. A capacitor may be used to adjust a gate voltage at a field gate and may have a first end coupled to the field gate and a second end coupled to the active gate or the source.

In an exemplary design, the at least one drain active strip may be formed within a drain active region (e.g., drain active region 580 in FIG. 6) between the active gate and the drain. In an exemplary design, the at least one STI strip may run between the drain and the active gate, e.g., as shown in FIG. 6.

In an exemplary design, a P-type or an N-type well (e.g., a P-body or an N-body) may be formed under the active gate, e.g., as shown in FIG. 5, 11, 12 or 13. A transistor gate oxide layer may be formed between the active gate and the P-type or N-type well. A transistor gate oxide layer may also be formed between each field gate and each drain active strip, e.g., as shown in FIG. 7C.

In an exemplary design, the semiconductor device may comprise an NMOS transistor having an N-type source and an N-type drain, e.g., as shown in FIG. 5 or 12. In another exemplary design, the semiconductor device may comprise a PMOS transistor having a P-type source and a P-type drain, e.g., as shown in FIG. 11 or 13. In an exemplary design, the semiconductor device may be fabricated over a buried oxide layer with a SOI IC process, e.g., as shown in FIG. 5 or 11. In another exemplary design, the semiconductor device may be fabricated with a bulk CMOS IC process, e.g., as shown in FIG. 12 or 13.

In another exemplary design, an IC may comprise a semiconductor device (e.g., a MOS transistor) comprising a source, a drain, and an active gate. The semiconductor device may further comprise at least one field gate located between the active gate and the drain, at least one STI strip formed transverse to the at least one field gate, and at least one drain active strip formed parallel to, and alternating with, the at least one STI strip. In an exemplary design, the IC may further comprise a buried oxide layer over which the source, the drain, the at least one STI strip, and the at least one drain active strip are formed, e.g., as shown in FIG. 5 or 11. In another exemplary design, the IC may further comprise (i) a P-type well (PW) over which the source and the active gate are formed and (ii) an N-type well (NW) over which the drain, the at least one field gate, the at least one STI strip, and the at least one drain active strip are formed, e.g., as shown in FIG. 12. In yet another exemplary design, the IC may further comprise (i) an N-type well over which the source and the active gate are formed and (ii) a P-type well over which the drain, the at least one field gate, the at least one STI strip, and the at least one drain active strip are formed, e.g., as shown in FIG. 13.

In yet another exemplary design, an apparatus (e.g., a wireless device, an IC, etc.) may comprise an active circuit comprising a semiconductor device having a source, a drain, and an active gate. The semiconductor device may further have at least one field gate located between the active gate and the drain, at least one STI strip formed transverse to the at least one field gate, and at least one drain active strip formed parallel to, and alternating with, the at least one STI strip. The active circuit may comprise a power amplifier, a PMIC, a switch, a DAC, an ADC, etc.

Figure 15:
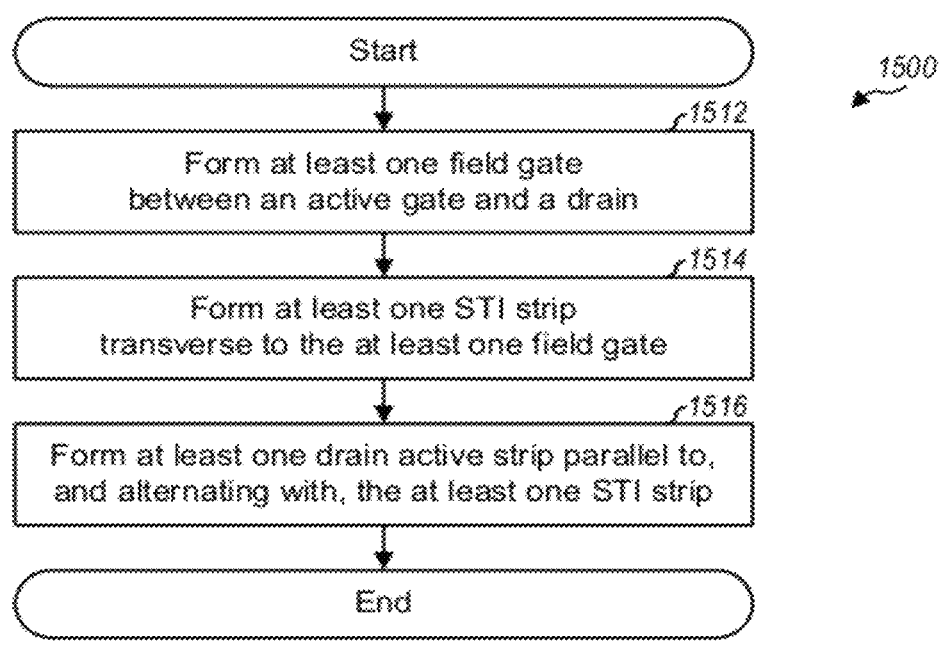
FIG. 15 shows a process for fabricating a high-speed high-power semiconductor device/MOS transistor.

FIG. 15 shows an exemplary design of a process 1500 for fabricating a high-speed high-power semiconductor device. A source of the semiconductor device may be formed, e.g., with an N+ region or a P+ region. A drain of the semiconductor device may be formed, e.g., with another N+ region or another P+ region. An active gate of the semiconductor device may be formed, e.g., parallel to the source and drain. At least one field gate of the semiconductor device may be formed between an active gate and a drain (block 1512). At least one STI strip may be formed transverse to the at least one field gate (block 1514). At least one drain active strip may be formed parallel to, and alternating with, the at least one STI strip (block 1516).

In an exemplary design, the source, the drain, the at least one STI strip, and the at least one drain active strip may be formed over a buried oxide layer, e.g., as shown in FIG. 5 or 11. In another exemplary design, the source and the active gate may be formed over a P-type well, and the drain, the at least one field gate, the at least one STI strip, and the at least one drain active strip may be formed over an N-type well, e.g., as shown in FIG. 12. In yet another exemplary design, the source and the active gate may be formed over an N-type well, and the drain, the at least one field gate, the at least one STI strip, and the at least one drain active strip may be formed over a P-type well, e.g., as shown in FIG. 13.

A high-speed high-power semiconductor device described herein may be implemented on an IC, an analog IC, an RFIC, a mixed-signal IC, an application specific integrated circuit (ASIC), an electronic device, etc. A high-speed high-power semiconductor device may also be fabricated with various IC process technologies such as CMOS, NMOS, PMOS, bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), SOI, etc.

An apparatus implementing a high-speed high-power semiconductor device described herein may be a stand-alone device or may be part of a larger device. The apparatus may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
at least one field gate located between an active gate and a drain,
at least one shallow trench isolation (STI) strip formed transverse to the at least one field gate and extending across the at least one field gate and to the drain, and
at least one drain active strip formed parallel to, and alternating with, the at least one STI strip.

2. The apparatus of claim 1, wherein the at least one field gate comprises a single field gate.

3. The apparatus of claim 1, wherein each of the at least one field gate has a length equal to or greater than a length of the active gate.

4. The apparatus of claim 1, wherein each of the at least one field gate is located less than or equal to twice a minimum poly spacing from the active gate or another field gate of the at least one field gate.

5. The apparatus of claim 1, wherein the at least one drain active strip is formed within a drain active region between the active gate and the drain.

6. The apparatus of claim 1, wherein the at least one STI strip runs between the drain and the active gate.

7. The apparatus of claim 1 comprising a semiconductor device comprising:
a P-type or an N-type well formed under the active gate; and
a transistor gate oxide layer formed between the active gate and the P-type or the N-type well.

8. The apparatus of claim 1 comprising a semiconductor device comprising a transistor gate oxide layer formed between each field gate of the at least one field gate and each drain active strip of the at least one drain active strip.

9. The apparatus of claim 1, wherein each of the at least one field gate has a different voltage determined based on a first voltage at the active gate and a second voltage at the drain.

10. The apparatus of claim 1, further comprising:
a capacitor having a first end coupled to the active gate or a source and a second end coupled to one of the at least one field gate.

11. The apparatus of claim 1, wherein the active gate controls a field effect transistor (FET), and the at least one field gate controls a metal oxide semiconductor (MOS) varactor (VAR).

12. The apparatus of claim 1 comprising a semiconductor device comprising an N-channel metal oxide semiconductor (NMOS) transistor comprising the active gate, the NMOS transistor having an N-type source and the drain comprising an N-type drain.

13. The apparatus of claim 1 comprising a semiconductor device comprising a P-channel metal oxide semiconductor (PMOS) transistor comprising the active gate, the PMOS transistor having a P-type source and the drain comprising a P-type drain.

14. The apparatus of claim 1 fabricated over a buried oxide layer with a silicon-on-insulator (SOI) integrated circuit (IC) process.

15. The apparatus of claim 1 fabricated with a bulk complementary metal oxide semiconductor (CMOS) integrated circuit (IC) process.

16. The apparatus of claim 1, further comprising:
an active circuit comprising a semiconductor device having the at least one field gate, the at least one STI strip, and the at least one drain active strip.

17. The apparatus of claim 16, wherein the active circuit comprises a power amplifier.

18. The apparatus of claim 1 comprising an integrated circuit (IC).

19. A method comprising:
forming at least one field gate between an active gate and a drain;
forming at least one shallow trench isolation (STI) strip transverse to the at least one field gate and extending across the at least one field gate and to the drain; and
forming at least one drain active strip parallel to, and alternating with, the at least one STI strip.

20. The method of claim 19, further comprising:
forming a buried oxide layer over which a source, the drain, the at least one STI strip, and the at least one drain active strip are formed.

21. The method of claim 19, further comprising:
forming a P-type well over which a source and the active gate are formed; and
forming an N-type well over which the drain, the at least one field gate, the at least one STI strip, and the at least one drain active strip are formed.

22. The method of claim 19, further comprising:
forming an N-type well over which a source and the active gate are formed; and
forming a P-type well over which the drain, the at least one field gate, the at least one STI strip, and the at least one drain active strip are formed.

23. An apparatus comprising:
means for forming at least one field gate between an active gate and a drain;
means for forming at least one shallow trench isolation (STI) strip transverse to the at least one field gate and extending across the at least one field gate and to the drain; and
means for forming at least one drain active strip parallel to, and alternating with, the at least one STI strip.

24. The apparatus of claim 23, further comprising:
means for forming a buried oxide layer over which a source, the drain, the at least one STI strip, and the at least one drain active strip are formed.

25. The apparatus of claim 23, further comprising:
means for forming a P-type well over which a source and the active gate are formed; and
means for forming an N-type well over which the drain, the at least one field gate, the at least one STI strip, and the at least one drain active strip are formed.

* * * * *